United States Patent
Miya et al.

(10) Patent No.: US 7,811,412 B2
(45) Date of Patent: Oct. 12, 2010

(54) SUBSTRATE PROCESSING APPARATUS AND SUBSTRATE PROCESSING METHOD DRYING SUBSTRATE

(75) Inventors: Katsuhiko Miya, Kyoto (JP); Akira Izumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/648,918

(22) Filed: Aug. 27, 2003

(65) Prior Publication Data

US 2004/0040584 A1    Mar. 4, 2004

(30) Foreign Application Priority Data

Aug. 29, 2002 (JP) .......................... P2002-251101
Jul. 7, 2003 (JP) .......................... P2003-192898

(51) Int. Cl.
*H01L 21/304* (2006.01)

(52) U.S. Cl. .................. 156/345.55; 118/730; 134/113

(58) Field of Classification Search ............ 156/345.55, 156/345.34; 134/113, 98.1, 902, 50, 94.1, 134/95.1, 99.1, 149; 118/730
See application file for complete search history.

(56) References Cited

U.S. PATENT DOCUMENTS

| | | | | |
|---|---|---|---|---|
| 5,522,412 A | * | 6/1996 | Ohba et al. | 134/104.1 |
| 5,772,764 A | * | 6/1998 | Akimoto | 118/319 |
| 6,247,479 B1 | * | 6/2001 | Taniyama et al. | 134/95.2 |
| 6,514,570 B1 | * | 2/2003 | Matsuyama et al. | 430/311 |
| 6,669,808 B2 | * | 12/2003 | Adachi et al. | 156/345.11 |
| 6,810,888 B2 | * | 11/2004 | Tsuchiya et al. | 134/104.2 |
| 6,832,616 B2 | * | 12/2004 | Miyazaki | 134/98.1 |

(Continued)

FOREIGN PATENT DOCUMENTS

JP    7-22361    1/1995

(Continued)

OTHER PUBLICATIONS

Japanese Office Action dated Jul. 15, 2008 in Japanese counterpart application No. 2003-192898 with translation.

(Continued)

*Primary Examiner*—Sylvia R. MacArthur
(74) *Attorney, Agent, or Firm*—Ostrolenk Faber LLP

(57) ABSTRACT

A substrate processing apparatus comprises a spin chuck holding and rotating a substrate and an atmosphere blocking member, corresponding in planar shape and size to the substrate, arranged oppositely and proximately to the upper surface of the substrate and formed with a processing solution discharge port and a gas discharge port discharging a processing solution and gas to the central portion of the upper surface of the substrate respectively. The atmosphere blocking member is formed with an outer gas discharge port outside the gas discharge port in plan view for discharging the gas to the upper surface of the substrate. The outer gas discharge port is so formed on the atmosphere blocking member that an arrival position of the gas discharged from the outer gas discharge port is closer to the center of the upper surface of the substrate held by a spin base than an intermediate portion between the center and the outer peripheral edge of the upper surface. Thus provided is an apparatus capable of effectively expelling droplets remaining on the substrate before spin-drying the substrate by high-speed rotation.

2 Claims, 18 Drawing Sheets

U.S. PATENT DOCUMENTS

2002/0074020 A1  6/2002  Ono et al.
2005/0276921 A1* 12/2005  Miya et al. .................. 427/240
2006/0021636 A1*  2/2006  Miya ........................... 134/33

FOREIGN PATENT DOCUMENTS

| JP | 8-316190 | 11/1996 |
| JP | 11-176795 | 7/1999 |
| JP | 11-274135 | 10/1999 |
| JP | 2000-156363 | 6/2000 |
| JP | 2002-176026 | 6/2001 |

OTHER PUBLICATIONS

English translation of Abstract for Japanese Patent Application Laid Open No. 11-274135, dated: Oct. 1999.

English translation of Abstract for Japanese Patent Laid Open No. 11-176795, dated Jul. 1999.

Japanese Patent Application Laid Open No. 2002-176026 which is the counterpart, dated Jun. 2001, to U.S. Patent Application Publication No. 2002/0074020 A1.

* cited by examiner

F I G. 1
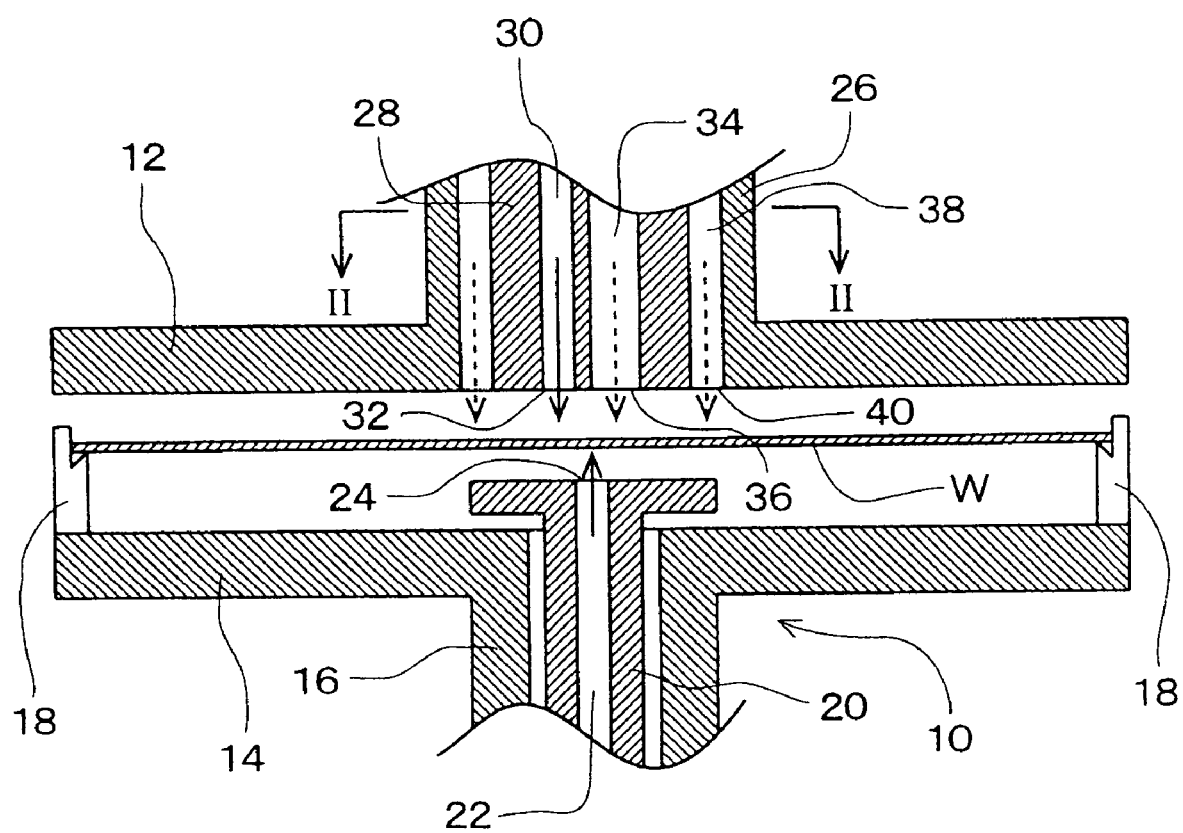

F I G. 2
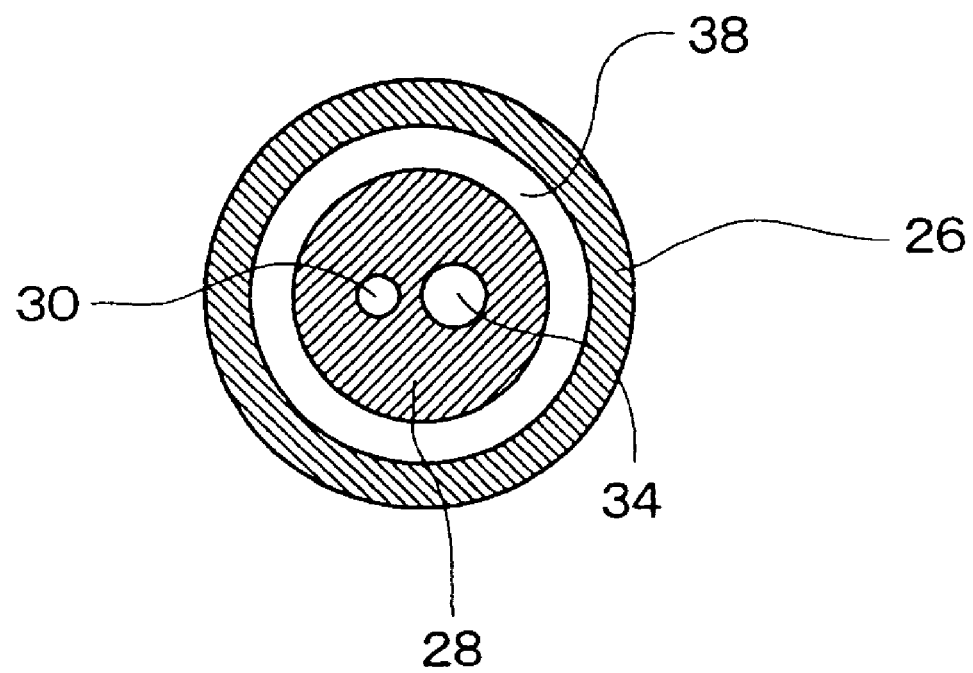

F I G. 3
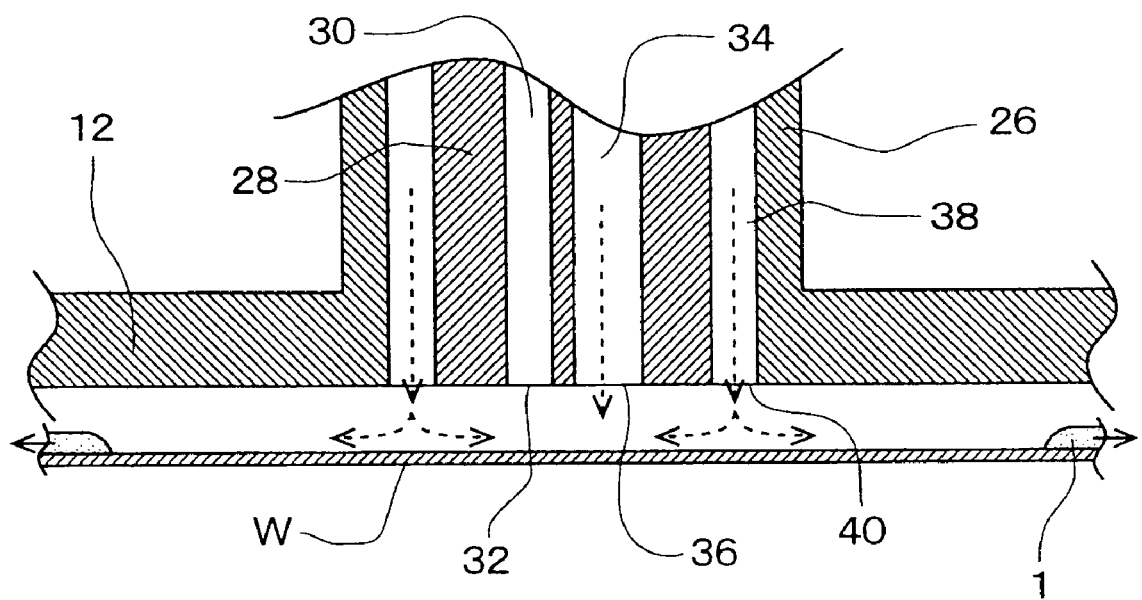

F I G . 6 A
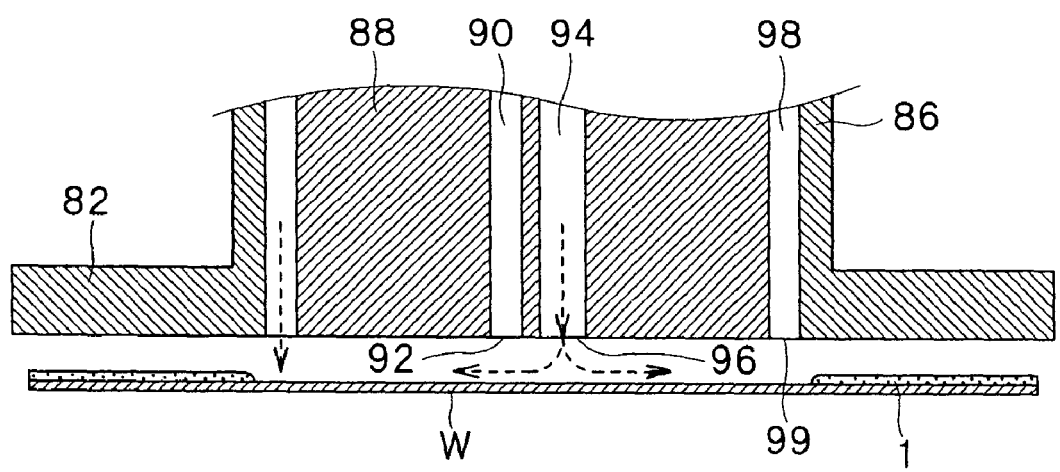
F I G . 6 B
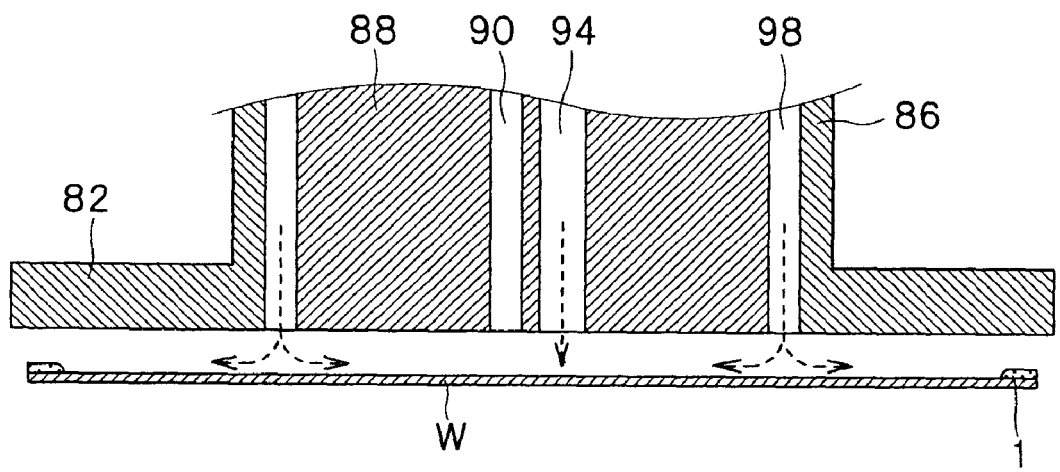

F I G. 11 A
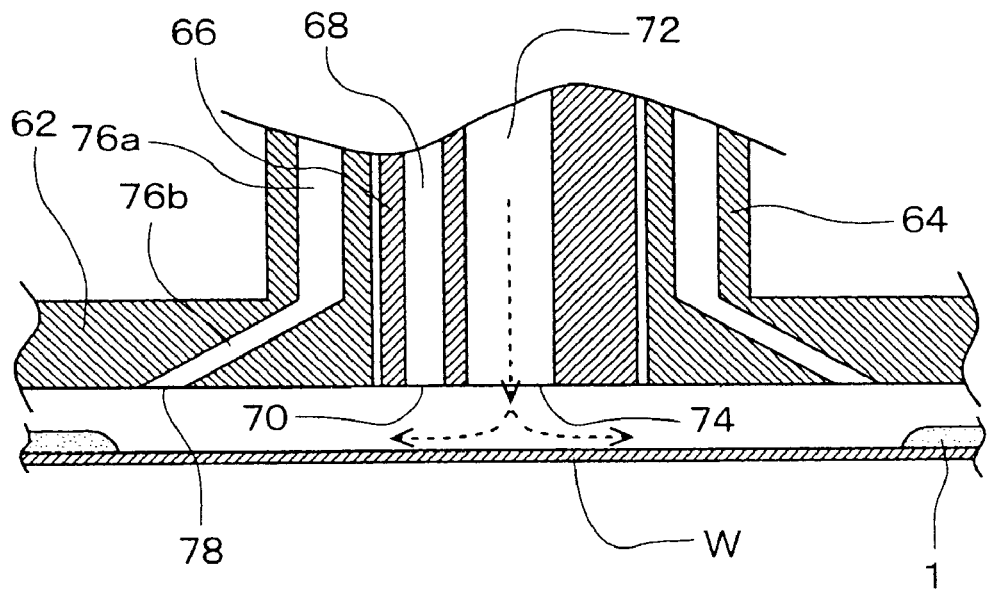
F I G. 11 B
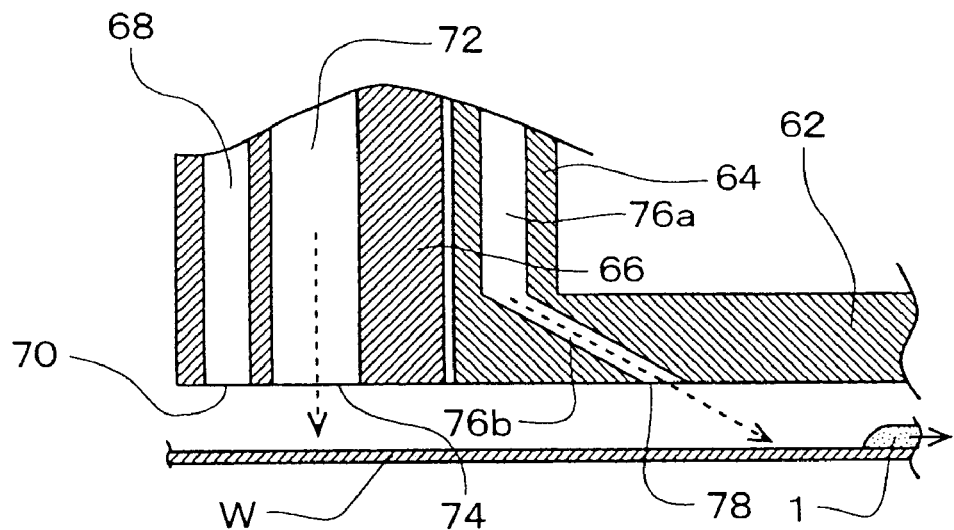

SUBSTRATE PROCESSING APPARATUS AND SUBSTRATE PROCESSING METHOD DRYING SUBSTRATE

BACKGROUND OF THE INVENTION

1. Field of the Invention

The present invention relates to a substrate processing apparatus and a substrate processing method rotating a substrate such as a semiconductor wafer or a substrate for an optical disk for performing processing such as cleaning by supplying a processing solution such as a chemical solution or deionized water to the substrate and supplying gas such as inert gas such as nitrogen gas or dry air to the substrate after or during the processing for drying the substrate.

2. Description of the Background Art

FIG. 12 is a partially fragmented schematic front elevational view of a conventional substrate processing apparatus, FIG. 13 is a longitudinal sectional view of a principal part thereof, and FIG. 14 is a sectional view taken along the line XI-XI in FIG. 13. The apparatus illustrated in FIGS. 12 to 14 is a substrate processing apparatus of a single-substrate type performing cleaning processing with a chemical solution, rinse processing with deionized water and spin-drying processing on both of the upper and lower surfaces of a substrate.

This substrate processing apparatus comprises a spin chuck 100 horizontally holding and rotating a substrate such as a semiconductor wafer W, for example, and an atmosphere blocking member 102 arranged oppositely and proximately to the upper surface of the wafer W held by the spin chuck 100. The atmosphere blocking member 102 is in the form of a disc corresponding in planar size to the wafer W.

The spin chuck 100 is constituted of a discoidal spin base 104 holding the wafer W on its upper surface and a rotary cylinder 106 suspended from the central portion of the lower surface of the spin base 104. At least three chuck pins 108 for grasping the peripheral edge of the wafer W and holding the wafer W at a space from the upper surface of the spin base 104 are circumferentially uniformly distributed and embedded in the peripheral edge of the upper surface of the spin base 104. The spin base 104 also functions as an atmosphere blocking member arranged oppositely and proximately to the lower surface of the wafer W held by the same. A rotating/driving mechanism consisting of a motor 110, a driving pulley 112 fixed to the rotary shaft of the motor 100, a driven pulley 114 engaged with the outer peripheral surface of the rotary cylinder 106 and a belt 116 extended along the driving pulley 112 and the driven pulley 114 rotates the rotary cylinder 106 about a vertical axis. This rotation of the rotary cylinder 106 is followed by rotation of the wafer W and the spin base 104. A long, narrow cylindrical inner shaft 118 is inserted into the hollow portion of the rotary cylinder 106. The inner shaft 118 is fixedly uprighted and arranged coaxially with the rotary cylinder 106, while a bearing (not shown) is interposed between the outer peripheral surface of the inner shaft 118 and the inner peripheral surface of the rotary cylinder 106.

The atmosphere blocking member 102 is concatenated to the lower end of a rotary support cylinder 120. A long, narrow cylindrical inner shaft 122 is inserted into the hollow portion of the rotary support cylinder 120 similarly to the rotary cylinder 106 of the aforementioned spin chuck 100 although FIG. 12 illustrates no detailed structure, and this inner shaft 122 and the rotary support cylinder 120 are arranged coaxially with each other while a bearing (not shown) is interposed between the outer peripheral surface of the inner shaft 122 and the inner peripheral surface of the rotary support cylinder 120. The rotary support cylinder 120 is suspended from the forward end of a support arm 124 and supported to be rotatable by a motor 126 about a vertical axis. The motor 126 rotates the rotary support cylinder 120, thereby rotating the atmosphere blocking member 102 along with the rotary support cylinder 120. A vertical drive unit (not shown) consisting of a linear driving mechanism such as an air cylinder vertically reciprocates the rotary support cylinder 120 and the support arm 124. The atmosphere blocking member 102 approaches to and separates from the upper surface of the wafer W held on the spin base 104 due to the vertical reciprocation of the rotary support cylinder 120.

The inner shaft 122 inserted into the hollow portion of the rotary support cylinder 120 is formed on its axial portion with a processing solution supply passage 128 having a processing solution discharge port 130 on its lower end opposed to the upper surface of the wafer W held on the spin base 104. A space portion defined between the outer peripheral surface of the inner shaft 122 and the inner peripheral surface of the rotary support cylinder 120 constitutes a gas supply passage 132 having an annular gas discharge port 134 on its lower end. Similarly, the inner shaft 118 inserted into the hollow portion of the rotary cylinder 106 of the spin chuck 100 is formed on its axial portion with a processing solution supply passage 136 having a processing solution discharge port 138 on its upper end opposed to the lower surface of the wafer W held on the spin base 104. A space portion defined between the outer peripheral surface of the inner shaft 118 and the inner peripheral surface of the rotary cylinder 106 constitutes a gas supply passage 140 having an annular gas discharge part 142 on its upper end. The processing solution supply passages 128 and 136 are channel-connected to a processing solution supply part 144 supplying processing solutions such as a chemical solution and deionized water respectively. The gas supply passages 132 and 140 are channel-connected to a gas supply part 146 supplying process gas such as inert gas such as nitrogen gas or dry air respectively.

The aforementioned substrate processing apparatus performs processing in the following manner, for example: The substrate processing apparatus holds the wafer W on the spin base 104 of the spin chuck 100 and rotates the wafer W in a horizontal plane about a vertical axis. The processing solution supply part 144 supplies the chemical solution to the processing solution supply passages 128 and 136 so that the processing solution discharge ports 130 and 138 opening on the lower surface of the atmosphere blocking member 102 and the upper surface of the spin base 104 respectively discharge the chemical solution toward the central portions of the upper and lower surfaces of the wafer W respectively. The chemical solution discharged toward the central portions of the upper and lower surfaces of the wafer W is spread entirely over the wafer W due to centrifugal force following the rotation of the wafer W for cleaning the upper and lower surfaces of the wafer W.

When completely cleaning the wafer W with the chemical solution, the substrate processing apparatus switches the chemical solution supplied from the processing solution supply part 144 to the processing solution supply passages 128 and 136 to the deionized water, which in turn is discharged from the processing solution discharge ports 130 and 138 toward the central portions of the upper and lower surfaces of the wafer W respectively. The deionized water discharged toward the central portions of the upper and lower surfaces of the wafer W is spread entirely over the wafer W due to the centrifugal force following the rotation of the wafer W for rinsing the upper and lower surfaces of the wafer W. In the aforementioned cleaning processing with the chemical solution and/or the rinse processing with the deionized water, the substrate processing apparatus supplies process gas such as nitrogen gas from the gas supply part 146 to the gas supply passages 132 and 140 at need for discharging the process gas from the annular gas discharge ports 134 and 142 opening on the lower surface of the atmosphere blocking member 102 and the upper surface of the spin base 104 respectively toward the upper and lower surfaces of the wafer W respectively.

When completely rinsing the wafer W with the deionized water, the substrate processing apparatus stops discharging the deionized water from the processing solution discharge ports 130 and 138 and supplies the process gas from the gas supply part 146 to the gas supply passages 132 and 140. The substrate processing apparatus discharges the process gas from the annular gas discharge ports 134 and 142 toward the upper and lower surfaces of the wafer W respectively while rotating the wafer W for draining the deionized wafer remaining on the upper and lower surfaces of the wafer W from the peripheral edge of the wafer W due to the centrifugal force following the rotation of the wafer W thereby drying the upper and lower surfaces of the wafer W respectively. At this time, the process gas discharged from the gas discharge ports 134 and 142 toward the upper and lower surfaces of the wafer W respectively flows along the upper and lower surfaces of the wafer W respectively and is spread entirely over the wafer W for prompting drying of the wafer W.

Japanese Patent Application Laying-Open Gazette No. 11-274135 (1999) discloses a substrate processing apparatus having a processing solution discharge part and a gas discharge part different in structure from those shown in FIGS. 13 and 14. FIG. 16 is a longitudinal sectional view of a principal part of the substrate processing apparatus described in the aforementioned literature, and FIG. 17 is a sectional view taken along the line XIV-XIV in FIG. 16. As shown in FIGS. 16 and 17, an inner shaft 152 inserted into the hollow portion of a rotary support cylinder 150 concatenated with an atmosphere blocking member 148 on its lower end is formed with a gas supply passage 154 to be uncoaxial with the inner shaft 152. The atmosphere blocking member 148 is formed on its surface (lower surface) opposed to the upper surface of a wafer W held on a spin base 164 of a spin chuck 162 with a gas discharge port 156, which is eccentric to the wafer W. The inner shaft 152 is also formed with a processing solution supply passage 158 parallel to the gas supply passage 154, while the atmosphere blocking member 148 is formed on its surface opposed to the upper surface of the wafer W with a processing solution discharge port 160 adjacently to the gas discharge port 156.

Similarly, an inner shaft 168 inserted into the hollow portion of a rotary cylinder 166 of the spin chuck 162 is formed with a gas supply passage 170 to be uncoaxial with the inner shaft 168, and the spin base 164 is formed on its upper surface opposed to the lower surface of the wafer W held by the same with a gas discharge port 172 eccentrically to the wafer W. The inner shaft 168 is also formed with a processing solution supply passage 174 parallel to the gas supply passage 170, while the spin base 164 is formed on its upper surface with a processing solution discharge port 176 adjacently to the gas discharge port 172.

The aforementioned substrate processing apparatuses dry the wafer W by spin drying. In this case, droplets remaining on the wafer W not yet dried by high-speed rotation are scattered on the surface of the wafer W in high-speed rotation to cause formation of watermarks or adhesion of particles to the wafer W leading to a device failure or reduction of the yield. Droplets adhering to and remaining on the surface (lower surface) of the atmosphere blocking member 102 opposed to the wafer W also cause formation of watermarks or adhesion of particles.

Therefore, it is important to spin-dry the wafer W by high-speed rotation while completely expelling droplets from the wafer W and the lower surface of the atmosphere blocking member 102. Particularly when the substrate processing apparatus performs drying processing while approximating the atmosphere blocking member 102 to the wafer W held on the spin base 104, it is necessary to efficiently expel droplets remaining on the wafer W after the rinse processing while approximating the atmosphere blocking member 102 to the wafer W before spin-drying the wafer W by high-speed rotation.

In the conventional substrate processing apparatus shown in FIGS. 13 and 14, the gas discharge port 134 of the atmosphere blocking member 102 is annularly formed around the rotation center of the wafer W to enclose the processing solution discharge port 130 opposed to the central portion of the wafer W, for homogeneously discharging the process gas from the periphery of the processing solution discharge port 130. The spin base 104 serving as an atmosphere blocking member oppositely to the lower surface of the wafer W also has a similar structure. The substrate processing apparatus generally discharges the chemical solution or the deionized water from the processing solution discharge ports 130 and 138 toward the central portion of the wafer W while discharging the process gas such as nitrogen gas toward the central portion of the wafer W from the gas discharge ports 134 and 142 in the cleaning processing with the chemical solution or the rinse processing with the deionized water, and discharges only the process gas toward the central portion of the wafer W in the drying processing.

When the substrate processing apparatus having the structure shown in FIGS. 13 and 14 discharges the process gas toward the central portion of the wafer W from the gas discharge ports 134 and 142 in the drying processing, the process gas flows around the center of the wafer W as shown in FIG. 15 (while FIG. 15 shows only the upper surface of the wafer W, this also applies to the lower surface of the wafer W). The process gas discharged from the annular gas discharge port 134 toward the central portion of the wafer W forms a flow directed toward the center C of the wafer W in addition to a flow directed toward the periphery of the wafer W, as shown by broken lines in FIG. 15. The flow of the process gas directed from the annular periphery toward the center C of the wafer W inhibits droplets remaining on the central portion of the wafer W from centrifugal expulsion toward the periphery. In particular, droplets readily remain on the central portion of the wafer W due to smaller centrifugal force acting thereon as compared with that on the periphery. Consequently, drying is retarded on the central portion of the wafer W or droplets remaining on the central portion are scattered in high-speed rotation of the wafer W, to cause the aforementioned formation of watermarks or adhesion of particles.

In the substrate processing apparatus having the structure shown in FIGS. 16 and 17 disclosed in Japanese Patent Application Laying-Open Gazette No. 11-274135, process gas discharged from the gas discharge port 156 to a position deviating from the center C of the wafer W forms a powerful flow directed toward the center C of the wafer W as shown by a broken line in FIG. 18 (while FIG. 18 shows only the upper surface of the wafer W, this also applies to the lower surface of the wafer W), thereby expelling droplets remaining on the central portion of the wafer W toward the periphery.

Thus, the substrate processing apparatus having the structure shown in FIGS. 16 and 17 is extremely effective for preventing a liquid from remaining on the central portion of the wafer W. In this apparatus, however, it is difficult to remove droplets from the periphery of the wafer W with the process gas. While it is necessary to discharge the process gas from the gas discharge port 156 toward the central portion of the wafer W at a large flow rate in order to remove droplets from the periphery of the wafer W with the process gas, the droplets are scattered to readily adhere to the lower surface of the atmosphere blocking member 148 in this case, and it follows that the substrate processing apparatus uses the process gas beyond necessity. The range where the substrate processing apparatus can remove droplets from the wafer W by discharging the process gas toward the central portion of the wafer W is so limited that it is extremely difficult to completely remove droplets from the periphery of the wafer W with the process gas particularly when the wafer W has a large diameter of 300 mm. Thus, the substrate processing apparatus having the structure shown in FIGS. 16 and 17 cannot completely expel droplets remaining on the wafer W before spin-drying the wafer W by high-speed rotation either. Therefore, it is impossible to effectively prevent the aforementioned formation of watermarks or adhesion of particles to the wafer W.

SUMMARY OF THE INVENTION

The present invention is directed to a substrate processing apparatus supplying a fluid to a rotated substrate for performing prescribed processing.

According to the present invention, the substrate processing apparatus comprises a substrate holding/rotating element holding and rotating a substrate and an atmosphere blocking member, corresponding in planar shape and size to the substrate, arranged oppositely and proximately to at least one surface of the substrate held by the substrate holding/rotating element and formed with a processing solution discharge port and a gas discharge port discharging a processing solution and gas to the central portion of the surface of the substrate respectively, while an outer gas discharge port is formed on the atmosphere blocking member outside the gas discharge port in plan view for discharging gas to the surface of the substrate held by the substrate holding/rotating element.

Droplets washed away from the central portion of the substrate toward the periphery thereof with the gas discharged from the gas discharge port are expelled from the periphery with the gas discharged from the outer gas discharge port provided outside the gas discharge port, whereby the substrate processing apparatus can effectively expel droplets remaining on the substrate before spin-drying the substrate by high-speed rotation, and it is consequently possible to effectively prevent formation of watermarks or adhesion of particles to the substrate leading to a device failure or reduction of the yield.

Preferably, the outer gas discharge port is so formed on the atmosphere blocking member that an arrival position of the gas discharged from the outer gas discharge port is closer to the center of the surface of the substrate held by the substrate holding/rotating element than an intermediate portion between the center and the outer peripheral edge of the surface.

The substrate processing apparatus can further effectively expel droplets washed away from the central portion of the substrate toward the periphery thereof with the gas discharged from the gas discharge port.

The present invention is also directed to a substrate processing method supplying a fluid to a rotated substrate for performing prescribed processing.

Accordingly, an object of the present invention is to provide a substrate processing apparatus and a substrate processing method capable of effectively expelling droplets remaining on a substrate before spin-drying the substrate by high-speed rotation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view taken along the line II-II in FIG. 1;

FIG. 3 is a longitudinal sectional view of the principal part for illustrating the function of the apparatus shown in FIGS. 1 and 2;

FIGS. 6A and 6B are longitudinal sectional views of the principal part for illustrating the function of the apparatus shown in FIGS. 4 and 5;

FIGS. 11A and 11B are longitudinal sectional views of the principal part for illustrating the function of the apparatus shown in FIG. 10;

FIG. 17 is a sectional view taken along the line XIV-XIV in FIG. 16; and

DESCRIPTION OF THE PREFERRED EMBODIMENTS

Embodiments of the present invention are now described in detail with reference to the drawings.

1. First Embodiment

Figure 12:
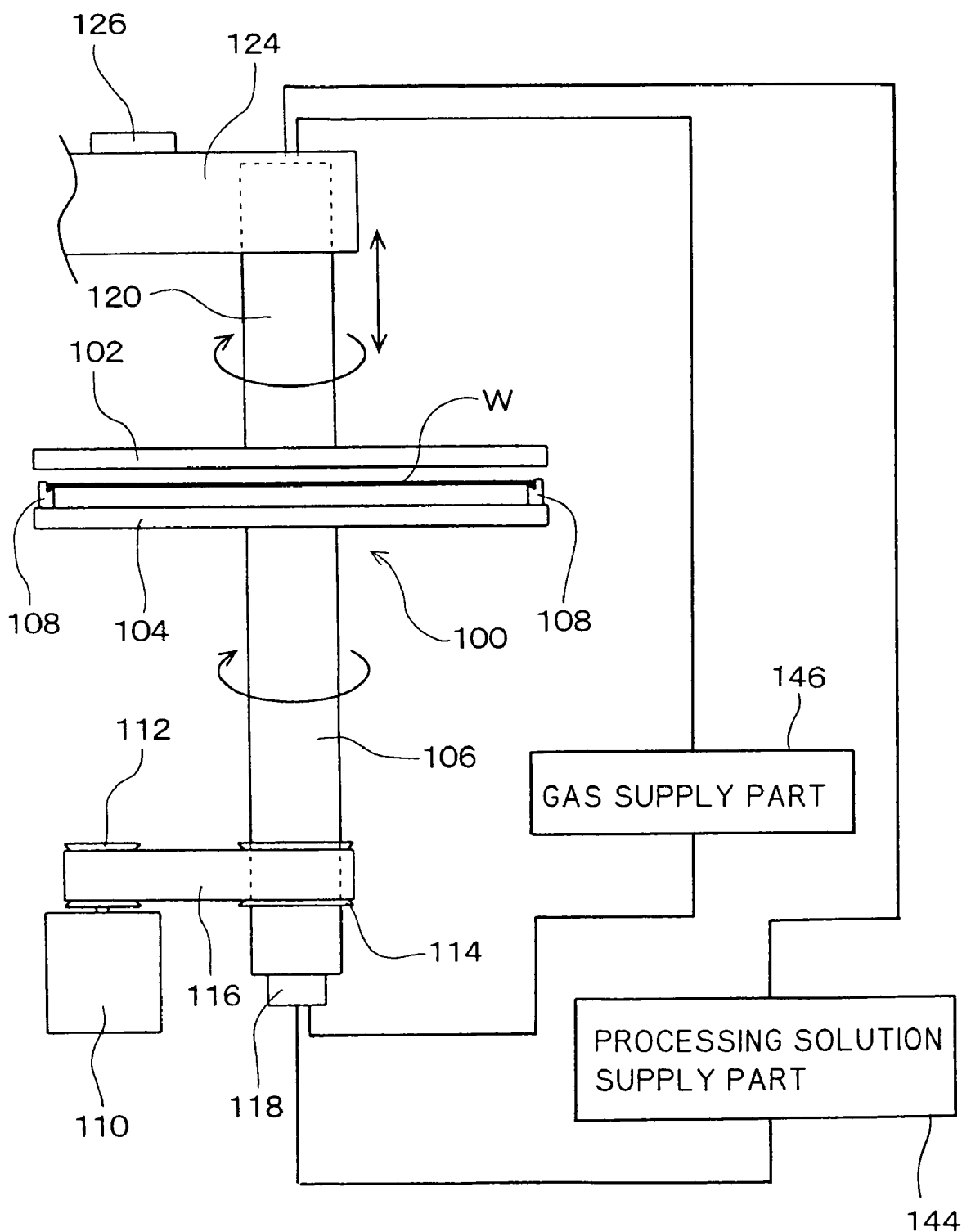
FIG. 12 is a partially fragmented schematic front elevational view showing the overall structure of an exemplary conventional substrate processing apparatus.
Figure 1:
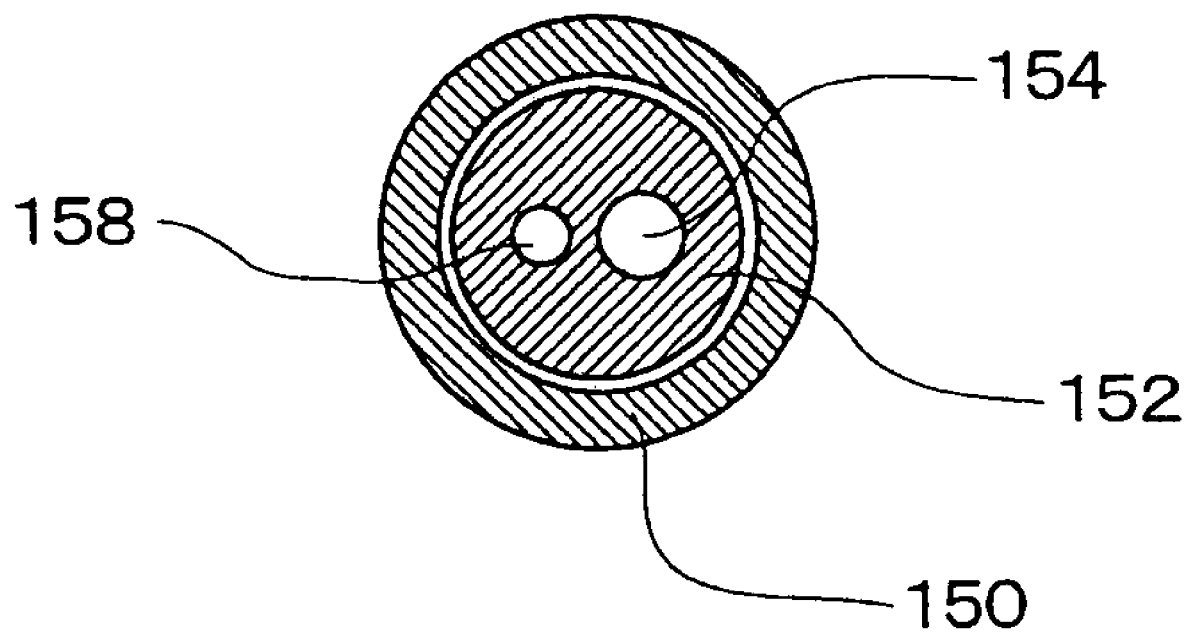
FIG. 1 is a longitudinal sectional view showing the structure of a principal part of a substrate processing apparatus according to a first embodiment of the present invention.
Figure 18:
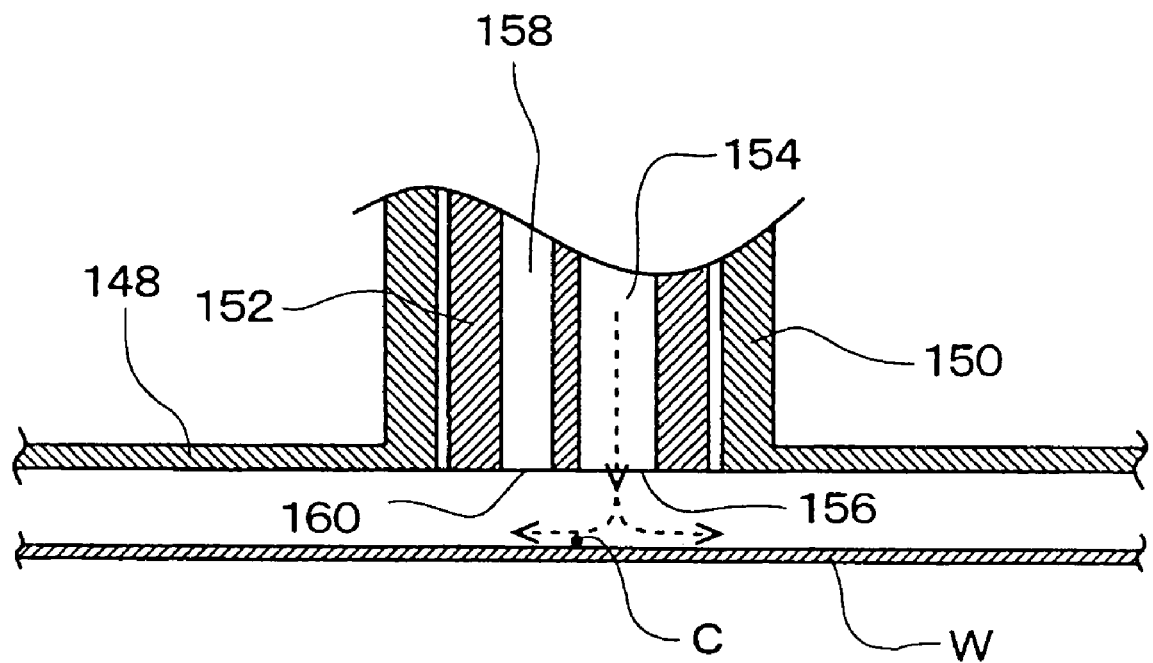
FIG. 18 is a longitudinal sectional view of the principal part for illustrating the function of the apparatus shown in FIGS. 16 and 17.

FIG. 1 is a longitudinal sectional view showing the structure of a principal part of a substrate processing apparatus according to a first embodiment of the present invention, and FIG. 2 is a sectional view taken along the line II-II in FIG. 1. This substrate processing apparatus is similar in overall structure and basic processing to the conventional substrate processing apparatus shown in FIG. 12, and hence redundant description is omitted.

This substrate processing apparatus comprises a spin chuck 10 horizontally holding and rotating a substrate such as a circular semiconductor wafer W, for example, and an atmosphere blocking member 12 arranged oppositely and proximately to the upper surface of the wafer W held on this spin chuck 10. The atmosphere blocking member 12 is in the form of a disc corresponding in planar shape and size to the wafer W.

The spin chuck 10 is constituted of a discoidal spin base 14 holding the wafer W on its upper surface and a rotary cylinder 16 suspended from the central portion of the lower surface of the spin base 14. At least three chuck pins 18 for grasping the peripheral edge of the wafer W and holding the wafer W at a space from the upper surface of the spin base 14 are circumferentially uniformly distributed and embedded in the peripheral edge of the upper surface of the spin base 14. A rotating/driving mechanism (not shown) rotates the rotary cylinder 16 about a vertical axis, thereby rotating the wafer W along with the spin base 14. A long, narrow cylindrical inner shaft 20 is inserted into the hollow portion of the rotary cylinder 16. The inner shaft 20 is fixedly uprighted and arranged coaxially with the rotary cylinder 16, while a bearing (not shown) is interposed between the outer peripheral surface of the inner shaft 20 and the inner peripheral surface of the rotary cylinder 16. The inner shaft 20 is formed on its axial portion with a processing solution supply passage 22 serving as the passage for processing solutions such as a chemical solution and deionized water and having a processing solution discharge port 24 on its upper end opposed to the lower surface of the wafer W held on the spin base 14.

The atmosphere blocking member 12 is concatenated to the lower end of a rotary support cylinder 26. A long, narrow cylindrical inner shaft 28 is inserted into the hollow portion of the rotary support cylinder 26, and this inner shaft 28 and the rotary support cylinder 26 are arranged coaxially with each other while a bearing (not shown) is interposed between the outer peripheral surface of the inner shaft 28 and the inner peripheral surface of the rotary support cylinder 26. The rotary support cylinder 26 is suspended from the forward end of a support arm (not shown) and suspended to be rotatable by a motor (not shown) about a vertical axis. The motor rotates the rotary support cylinder 26, thereby rotating the atmosphere blocking member 12 along with the rotary support cylinder 26. A vertical drive unit vertically reciprocates the rotary support cylinder 26. The atmosphere blocking member 12 approaches to and separates from the upper surface of the wafer W held on the spin base 14 due to the vertical reciprocation of the rotary support cylinder 26.

The inner shaft 28 inserted into the hollow portion of the rotary support cylinder 26 is formed with a processing solution supply passage 30 serving as the passage for the processing solutions such as the chemical solution and the deionized water and having a processing solution discharge port 32 on its lower end opposed to the upper surface of the wafer W held on the spin base 14. The inner shaft 28 is also formed with a gas supply passage 34 serving as the passage for process gas such as inert gas such as nitrogen gas or dry air and having a gas discharge port 36 on its lower end parallel to the processing solution supply passage 30. The gas discharge port 36 is formed on the surface of the atmosphere blocking member 12 opposed to the upper surface of the wafer W adjacently to the processing solution discharge port 32. The inner diametrical dimension of the gas supply passage 34 is rendered larger than that of the processing solution supply passage 30. While both of the processing solution supply passage 30 and the gas supply passage 34 are decentered from the inner shaft 28 eccentrically to the wafer W held on the spin base 14 in the illustrated example, the processing solution supply passage 30 or the gas supply passage 34 may alternatively be formed coaxially with the inner shaft 28.

In this apparatus, further, a space portion defined between the outer peripheral surface of the inner shaft 28 and the inner peripheral surface of the rotary support cylinder 26 constitutes an outer gas supply passage 38 having an annular outer gas discharge port 40 on its lower end. In other words, the atmosphere blocking member 12 is provided with, in addition to the gas discharge port 36 discharging the process gas toward the central portion of the upper surface of the wafer W, the outer gas discharge port 40 outside the gas discharge port 36 in plan view to annularly enclose the gas discharge port 36. Both of the gas discharge port 36 and the outer gas discharge port 40 are arranged inside the rotary support cylinder 26 supporting the atmosphere blocking member 12 in plan view, as shown in FIGS. 1 and 2.

According to the first embodiment, the outer gas discharge port 40 is provided proximately to the outer side of the gas discharge port 36 discharging the process gas toward the central portion of the upper surface of the wafer W. Therefore, the gas discharged from the outer gas discharge port 40 also arrives at a position around the center of the upper surface of the wafer W held on the spin base 14.

The substrate processing apparatus discharges the process gas from the gas discharge port 36 and the outer gas discharge port 40 of the atmosphere blocking member 12 after completely cleaning and rinsing the wafer W with the chemical solution and the deionized water respectively and before spin-drying the wafer W by high-speed rotation. At this time, the substrate processing apparatus discharges the process gas from the gas discharge port 36 of the atmosphere blocking member 12 toward the central portion of the upper surface of the wafer W thereby washing away droplets remaining on the central portion of the upper surface of the wafer W toward the periphery and expelling the same from the central portion of the wafer W. The substrate processing apparatus further discharges the process gas from the outer gas discharge port 40 of the atmosphere blocking member 12 to a portion close to the center of the upper surface of the wafer W thereby scattering droplets remaining on the periphery of the upper surface of the wafer W or washed away from the central portion to the periphery from the periphery of the wafer W to the outer peripheral direction and expelling the same from the periphery. Thus, the substrate processing apparatus expels all droplets remaining on the wafer W. This substrate processing apparatus may not discharge the process gas from the gas discharge port 36 toward the central portion of the wafer W at a large flow rate, whereby no droplets are splashed and scattered from the upper surface of the wafer W to adhere to the lower surface of the atmosphere blocking member 12 and the substrate processing apparatus does not use the process gas beyond necessity. The substrate processing apparatus discharges the process gas from the gas discharge port 36 toward the central portion of the upper surface of the wafer W at need when cleaning and/or rinsing the wafer W with the chemical solution and/or the deionized water. In subsequent spin drying, the substrate processing apparatus continuously discharges the process gas from the gas discharge port 36 and the outer gas discharge port 40.

The outer gas discharge port 40 generally discharges the process gas at a larger flow rate than the gas discharge port 36. When the outer gas discharge port 40 is so arranged on the atmosphere blocking member 12 as to discharge the process gas to the portion close to the center of the upper surface of the wafer W as in the first embodiment, the substrate processing apparatus generally discharges the gas from the gas discharge port 36 and the outer gas discharge port 40 substantially at the same time, as shown in FIG. 3. At this time, the substrate processing apparatus properly adjusts flow rate balance of the process gas discharged from the discharge ports 36 and 40 thereby expelling droplets from the central portion of the upper surface of the wafer W with the process gas discharged from the gas discharge port 36 while removing droplets from the periphery of the wafer W with the process gas discharged from the outer gas discharge port 40. When the substrate processing apparatus discharges the process gas to the upper surface of the wafer W at a flow rate of 100 l/min., for example, the substrate processing apparatus discharges the process gas from the gas discharge port 36 and the outer gas discharge port 40 at flow rates of 20 l/min. and 80 l/min. respectively.

2. Second Embodiment

Figure 4:
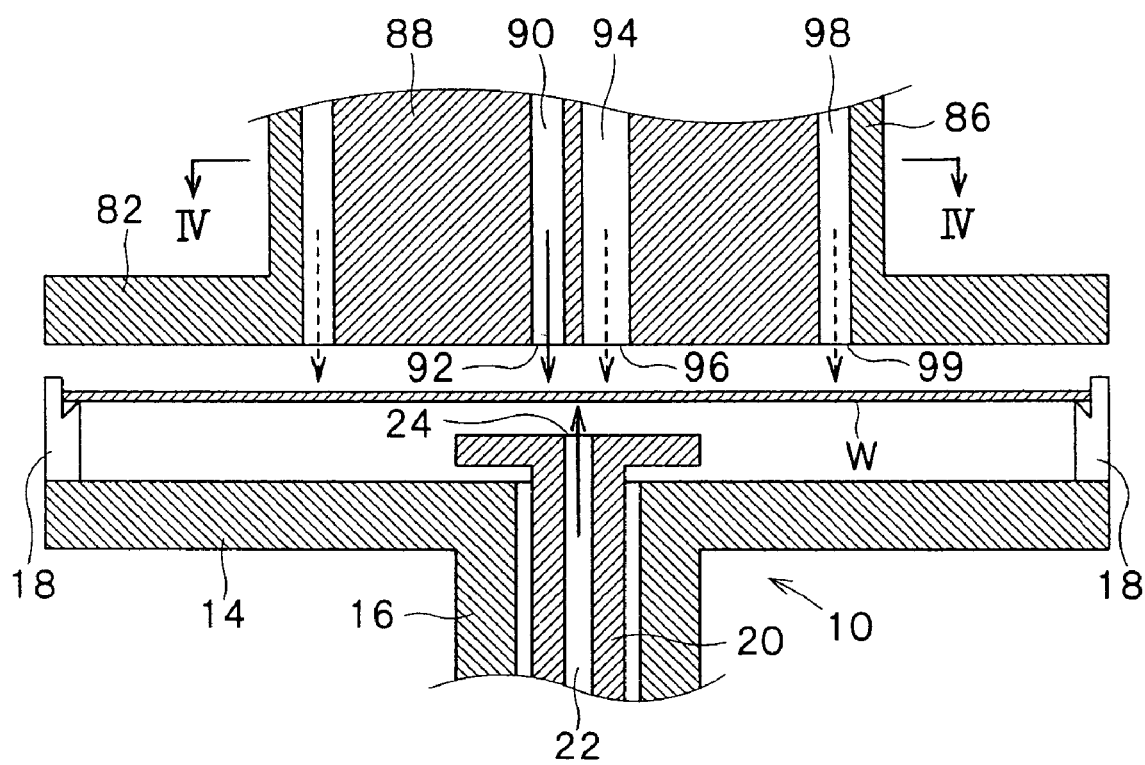
FIG. 4 is a longitudinal sectional view showing the structure of a principal part of a substrate processing apparatus according to a second embodiment of the present invention.
Figure 5:
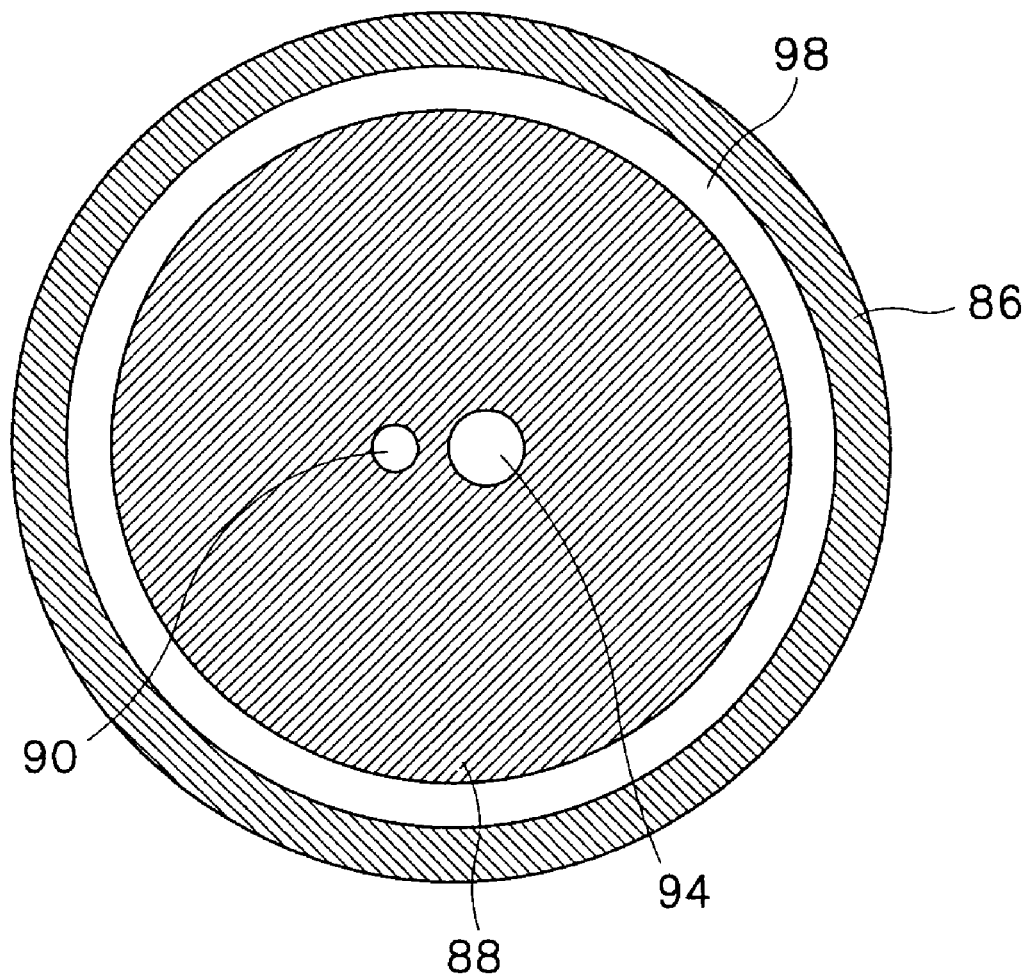
FIG. 5 is a sectional view taken along the line IV-IV in FIG. 4.

A second embodiment of the present invention is now described. FIG. 4 is a longitudinal sectional view showing the structure of a principal part of a substrate processing apparatus according to the second embodiment, and FIG. 5 is a sectional view taken along the line IV-IV in FIG. 4. Referring to FIG. 4, members denoted by the same reference numerals as those in FIG. 1 have the same functions as those described with reference to FIG. 1, and redundant description is omitted. The substrate processing apparatus according to the second embodiment is similar in overall structure and basic processing to the conventional apparatus shown in FIG. 12 similarly to the first embodiment, and hence redundant description is omitted.

Similarly to the substrate processing apparatus according to the first embodiment, an atmosphere blocking member 82 arranged oppositely and proximately to the upper surface of a wafer W held on a spin chuck 10 is concatenated to the lower end of a rotary support cylinder 86. A cylindrical inner shaft 88 is inserted into the hollow portion of the rotary support cylinder 86, and this inner shaft 88 and the rotary support cylinder 86 are arranged coaxially with each other while a bearing (not shown) is interposed between the outer peripheral surface of the inner shaft 88 and the inner peripheral surface of the rotary support cylinder 86. The rotary support cylinder 86 is suspended from the forward end of a support arm (not shown) and supported to be rotatable by a motor (not shown) about a vertical axis. The motor rotates the rotary support cylinder 86, thereby rotating the atmosphere blocking member 82 along with the rotary support cylinder 86. A vertical drive unit vertically reciprocates the rotary support cylinder 86, so that the atmosphere blocking member 82 approaches to and separates from the upper surface of the wafer W held on a spin base 14 due to the vertical reciprocation of the rotary support cylinder 86.

The inner shaft 88 inserted into the hollow portion of the rotary support cylinder 86 is formed with a processing solution supply passage 90 serving as the passage for processing solutions such as a chemical solution and deionized water and having a processing solution discharge port 92 on its lower end opposed to the upper surface of the wafer W held on the spin base 14. The inner shaft 88 is also formed with a gas supply passage 94 serving as the passage for process gas such as inert gas such as nitrogen gas or dry air and having a gas discharge port 96 on its lower end parallel to the processing solution supply passage 90. The gas discharge port 96 is formed on the surface of the atmosphere blocking member 82 opposed to the upper surface of the wafer W adjacently to the processing solution discharge port 92. The inner diametrical dimension of the gas supply passage 94 is rendered larger than that of the processing solution supply passage 90. While both of the processing solution supply passage 90 and the gas supply passage 94 are decentered from the inner shaft 88 eccentrically to the wafer W held on the spin base 14 in the illustrated example, the processing solution supply passage 90 or the gas supply passage 94 may alternatively be formed coaxially with the inner shaft 88.

Also in the apparatus according to the second embodiment, a space portion defined between the outer peripheral surface of the inner shaft 88 and the inner peripheral surface of the rotary support cylinder 86 constitutes an outer gas supply passage 98 having an annular outer gas discharge port 99 on its lower end. In other words, the atmosphere blocking member 82 is provided with, in addition to the gas discharge port 96 discharging the process gas toward the central portion of the upper surface of the wafer W, the outer gas discharge port 99 outside the gas discharge port 96 in plan view to annularly enclose the gas discharge port 96. Both of the gas discharge port 96 and the outer gas discharge port 99 are arranged inside the rotary support cylinder 86 supporting the atmosphere blocking member 82 in plan view, as shown in FIGS. 4 and 5.

According to the second embodiment, the outer gas discharge port 99 is provided separately from the gas discharge port 96 discharging the process gas toward the central portion of the upper surface of the wafer W. More specifically, the outer gas discharge port 99 is so formed on the atmosphere blocking member 82 that the gas discharged from the outer gas discharge port 99 arrives at a position around an intermediate portion between the center and the outer peripheral edge of the upper surface of the wafer W held on the spin base 14.

The substrate processing apparatus discharges the process gas from the gas discharge port 96 and the outer gas discharge port 99 of the atmosphere blocking member 82 after completely cleaning and rinsing the wafer W with the chemical solution and the deionized water respectively and before spin-drying the wafer W by high-speed rotation. At this time, the substrate processing apparatus discharges the process gas from the gas discharge port 96 of the atmosphere blocking member 82 toward the central portion of the upper surface of the wafer W thereby washing away droplets remaining on the central portion of the upper surface of the wafer W toward the periphery and expelling the same from the central portion of the wafer W. The substrate processing apparatus further discharges the process gas from the outer gas discharge port 99 of the atmosphere blocking member 82 to the upper surface of the wafer W thereby scattering droplets remaining on the periphery of the upper surface of the wafer W or washed away from the central portion to the periphery from the periphery of the wafer W to the outer peripheral direction and expelling the same from the periphery. Thus, the substrate processing apparatus expels all droplets remaining on the wafer W. This substrate processing apparatus may not discharge the process gas from the gas discharge port 96 toward the central portion of the wafer W at a large flow rate, whereby no droplets are splashed and scattered from the upper surface of the wafer W to adhere to the lower surface of the atmosphere blocking member 82 and the substrate processing apparatus does not use the process gas beyond necessity. The substrate processing apparatus discharges the process gas from the gas discharge port 96 toward the central portion of the upper surface of the wafer W at need when cleaning and/or rinsing the wafer W with the chemical solution and/or the deionized water. In subsequent spin drying, the substrate processing apparatus continuously discharges the process gas from the gas discharge port 96 and the outer gas discharge port 99.

The outer gas discharge port 99 generally discharges the process gas at a larger flow rate than the gas discharge port 96, similarly to the first embodiment. When the outer gas discharge port 99 is so arranged on the atmosphere blocking member 82 as to discharge the process gas to the portion close to the intermediate portion between the center and the outer peripheral edge of the upper surface of the wafer W as in the second embodiment, the substrate processing apparatus generally discharges the process gas from the outer gas discharge port 99 in a delay from that discharged from the gas discharge port 96. In other words, the substrate processing apparatus first discharges the process gas from the gas discharge port 96 toward the central portion of the upper surface of the wafer W at a flow rate of 20 l/min., for example, for washing away the deionized water 1 remaining on the central portion of the upper surface of the wafer W to the periphery of the wafer W and expelling the same from the central portion of the wafer W, as shown in FIG. 6A. At this time, the substrate processing apparatus washes away the deionized water 1 to a portion around the intermediate portion between the center and the outer peripheral edge of the upper surface of the wafer W with the process gas discharged from the gas discharge port 96.

Then, the substrate processing apparatus discharges the process gas from the outer gas discharge port 99 to the portion around the intermediate portion between the center and the outer peripheral edge of the upper surface of the wafer W at a flow rate of 80 l/min., for example, as shown in FIG. 6B, for scattering the deionized water 1 washed away from the central portion of the upper surface of the wafer W to the aforementioned portion around the intermediate portion from the periphery of the wafer W in the outer peripheral direction along with deionized water originally remaining on the periphery for expelling the same from the periphery. After discharging the process gas from the outer gas discharge port 99, the substrate processing apparatus may stop or keep discharging the process gas from the gas discharge port 96, or may stop discharging the process gas from the gas discharge port 96 alone after a lapse of a prescribed time from starting discharging the process gas through the outer gas discharge port 99.

According to the second embodiment, the substrate processing apparatus washes away the deionized water 1 from the central portion to the portion around the intermediate portion between the center and the outer peripheral edge of the upper surface of the wafer W by discharging the process gas from the gas discharge port 96. The substrate processing apparatus further discharges the process gas from the outer gas discharge port 99 to the portion around the intermediate portion. In other words, the substrate processing apparatus discharges the process gas from the outer gas discharge port 99 to a limit position capable of expelling the deionized water 1 with the process gas discharged from the gas discharge port 96. Therefore, the substrate processing apparatus according to the second embodiment has a larger effect of expelling the deionized water with the process gas discharged from the outer gas discharge port 99 as compared with the apparatus according to the first embodiment, and can efficiently scatter the deionized water from the periphery of the wafer W to the outer peripheral direction.

3. Third Embodiment

Figure 7:
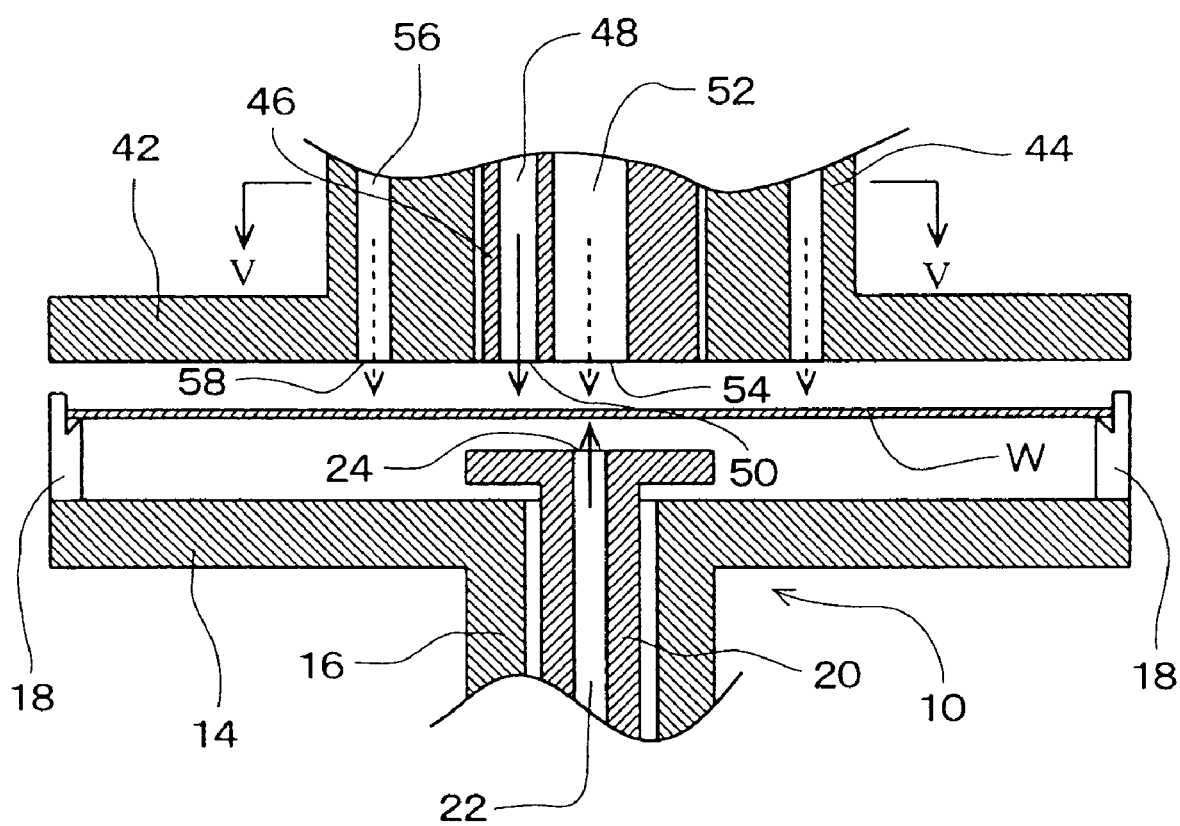
FIG. 7 is a longitudinal sectional view showing the structure of a principal part of a substrate processing apparatus according to a third embodiment of the present invention.
Figure 8:
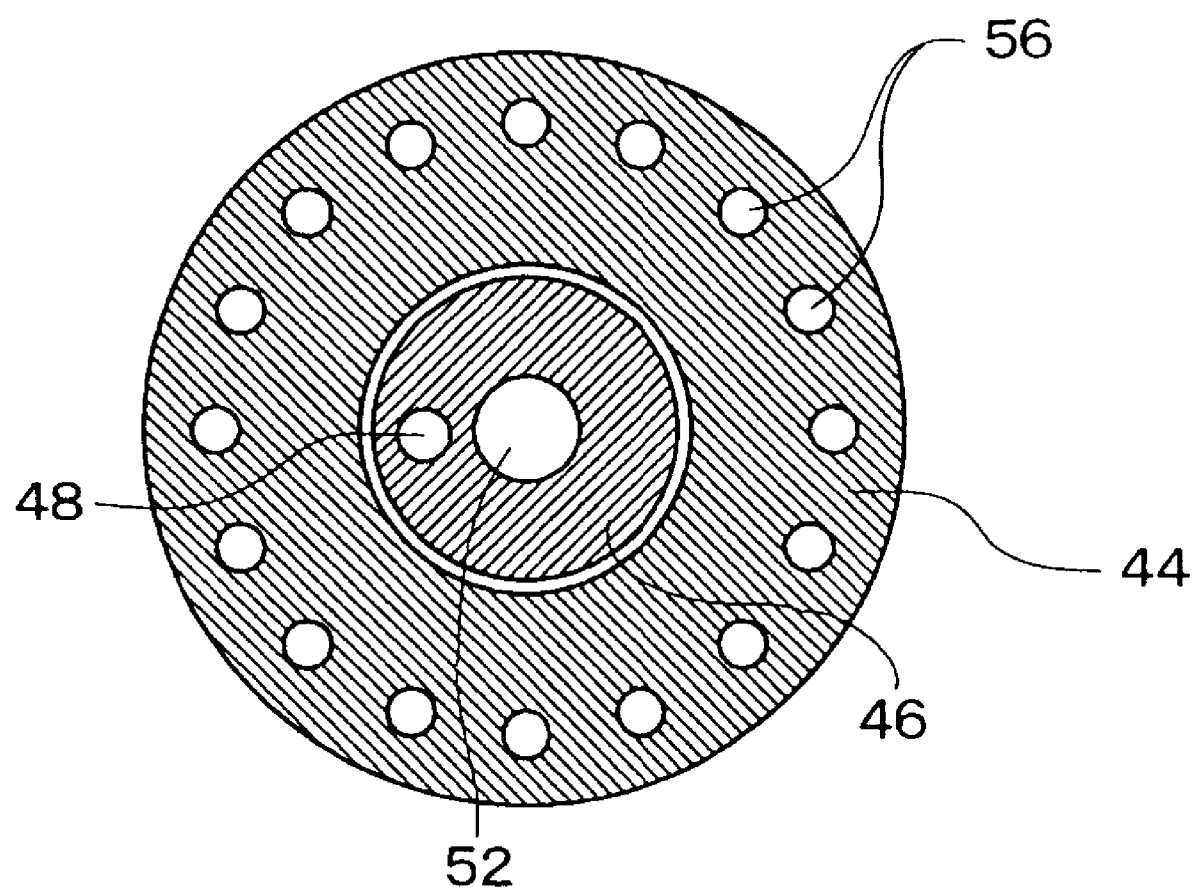
FIG. 8 is a sectional view taken along the line V-V in FIG. 7.

A third embodiment of the present invention is now described. FIG. 7 is a longitudinal sectional view showing the structure of a principal part of a substrate processing apparatus according to the third embodiment, and FIG. 8 is a sectional view taken along the line V-V in FIG. 7. Referring to FIG. 7, members denoted by the same reference numerals as those in FIG. 1 have the same functions as those described with reference to FIG. 1, and redundant description is omitted.

Similarly to the substrate processing apparatus according to the first embodiment, an atmosphere blocking member 42 arranged oppositely and proximately to the upper surface of a wafer W held on a spin chuck 10 is concatenated to the lower end of a rotary support cylinder 44, and a long, narrow cylindrical inner shaft 46 is inserted into the hollow portion of the rotary support cylinder 44. The inner shaft 46 is arranged coaxially with the rotary support cylinder 44, which is supported to be rotatable about a vertical axis so that the atmosphere blocking member 42 is rotated along with the rotary support cylinder 44. The remaining basic structure of the substrate processing apparatus according to the third embodiment is similar to that of the substrate processing apparatus according to the first embodiment shown in FIGS. 1 and 2.

Also in the substrate processing apparatus according to the third embodiment, the inner shaft 46 inserted into the hollow portion of the rotary support cylinder 44 is formed with a processing solution supply passage 48 serving as the passage for processing solutions such as a chemical solution and deionized water and having a processing solution discharge port 50 on its lower end opposed to the upper surface of the wafer W held on a spin base 14. The inner shaft 46 is also formed with a gas supply passage 52 serving as the passage for process gas such as inert gas such as nitrogen gas or dry air and having a gas discharge port 54 on its lower end parallel to the processing solution supply passage 48. The gas discharge port 54 is formed on the surface of the atmosphere blocking member 42 opposed to the upper surface of the wafer W adjacently to the processing solution discharge port 50. The gas supply passage 52 is formed coaxially with the inner shaft 46, for discharging the process gas from the gas discharge port 54 toward the central portion of the wafer W held on the spin base 14. The inner diametrical dimension of the gas supply passage 52 is rendered larger than that of the processing solution supply passage 48.

In this apparatus, a plurality of outer gas supply passages 56 are circumferentially uniformly distributed on circumferential positions of the rotary support cylinder 44 about the axis of the gas supply passage 52 formed on the inner shaft 46, and formed in parallel with the axis of the gas supply passage 52 respectively. The plurality of outer gas supply passages 56 are formed on the lower ends thereof with a plurality of outer gas discharge ports 58, which are circumferentially uniformly distributed on the surface of the atmosphere blocking member 42 opposed to the upper surface of the wafer W to enclose the gas discharge port 54.

The substrate processing apparatus discharges the process gas from the gas discharge port 54 and the plurality of outer gas discharge ports 58 of the atmosphere blocking member 42 similarly to the apparatus according to the first embodiment, to attain a similar function/effect.

Figure 9A:
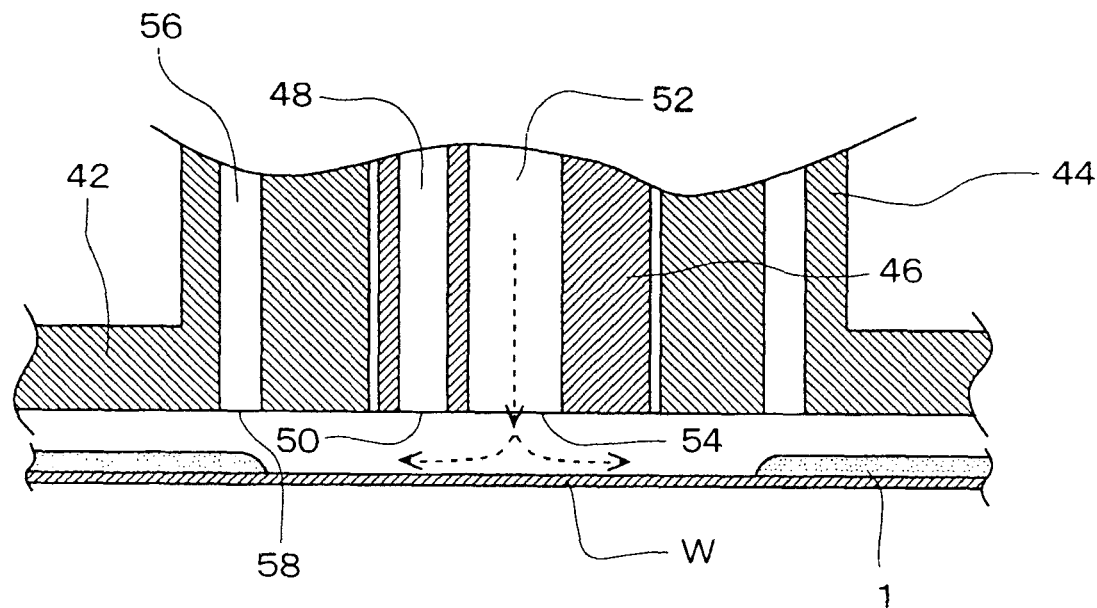
FIGS. 9A and 9B are longitudinal sectional views of the principal part for illustrating the function of the apparatus shown in FIGS. 7 and 8.
Figure 9B:
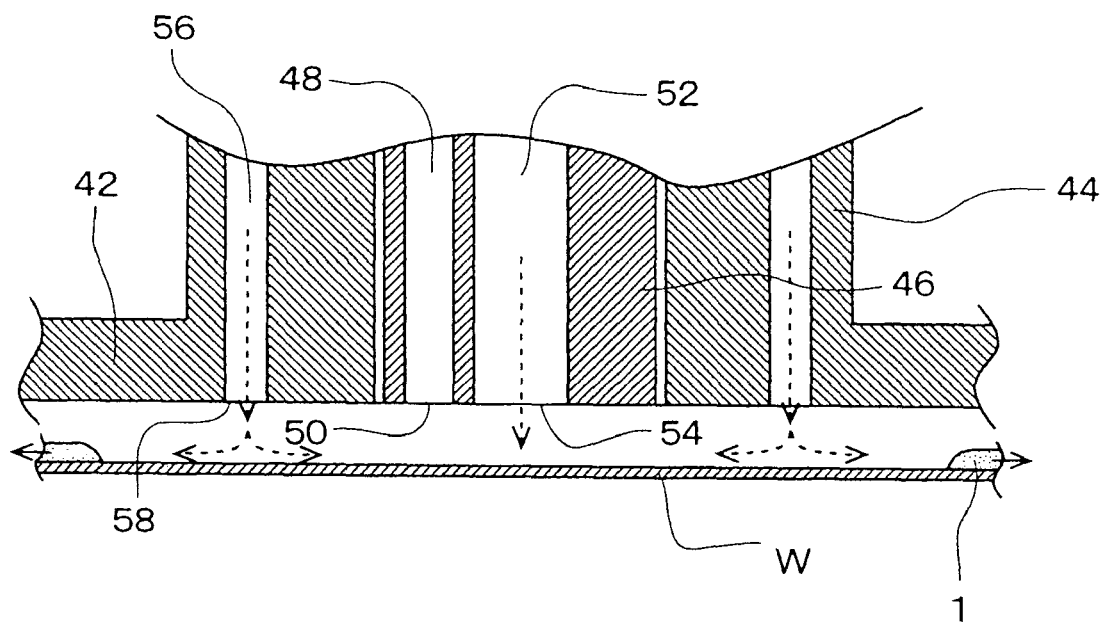

FIGS. 9A and 9B illustrate the plurality of outer gas discharge ports 58 starting discharging the process gas in a delay from the gas discharge port 54. As shown in FIG. 9A, the gas discharge port 54 first discharges the process gas toward the central portion of the upper surface of the wafer W for washing away deionized water 1 remaining on the central portion of the upper surface of the wafer W toward the periphery of the wafer W and expelling the same from the central portion of the wafer W. Then, the plurality of outer gas discharge ports 58 discharge the process gas toward the upper surface of the wafer W as shown in FIG. 9B, for scattering the deionized water 1 washed away from the central portion of the upper surface of the wafer W toward the periphery from the outer periphery to the outer peripheral direction along with deionized water originally remaining on the periphery and expelling the same. At this time, the substrate processing apparatus may stop or keep discharging the process gas from the gas discharge port 54 after starting discharging the process gas from the outer gas discharge ports 58, or may stop discharging the process gas from the gas discharge port 54 alone after a lapse of a prescribed time from starting discharging the process gas through the outer gas discharge ports 58.

4. Fourth Embodiment

Figure 10:
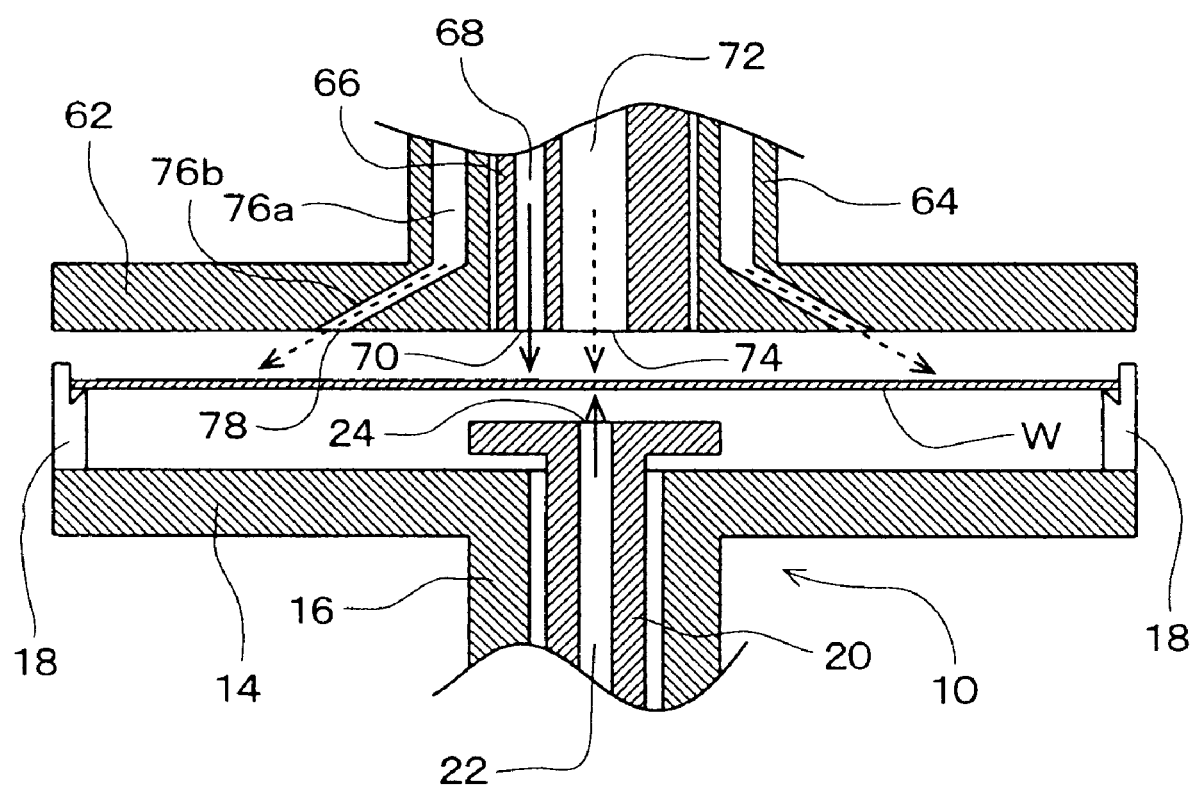
FIG. 10 is a longitudinal sectional view showing the structure of a principal part of a substrate processing apparatus according to a fourth embodiment of the present invention.

A fourth embodiment of the present invention is now described. FIG. 10 is a longitudinal sectional view showing the structure of a principal part of a substrate processing apparatus according to the fourth embodiment. Referring to FIG. 10, members denoted by the same reference numerals as those in FIG. 1 have the same functions as those described with reference to FIG. 1, and redundant description is omitted.

In this substrate processing apparatus, an inner shaft 66 inserted into the hollow portion of a rotary support cylinder 64 is formed with a processing solution supply passage 68 serving as the passage for processing solutions such as a chemical solution and deionized water and having a processing solution discharge port 70 on its lower end opposed to the upper surface of a wafer W held on a spin base 14, similarly to the apparatus shown in FIGS. 7 and 8. The inner shaft 66 is also formed with a gas supply passage 72 serving as the passage for process gas such as inert gas such as nitrogen gas or dry air and having a gas discharge port 74 on its lower end parallel to the processing solution supply passage 68. The gas discharge port 74 is formed on the surface of an atmosphere blocking member 62 opposed to the upper surface of the wafer W adjacently to the processing solution discharge port 70. The gas supply passage 72 is formed coaxially with the inner shaft 66, for discharging the process gas from the gas discharge port 74 toward the central portion of the wafer W held on the spin base 14. The inner diametrical dimension of the gas supply passage 72 is rendered larger than that of the processing solution supply passage 68.

Also in this apparatus, a plurality of outer gas supply passages 76a are circumferentially uniformly distributed on circumferential positions of the rotary support cylinder 64 about the axis of the gas supply passage 72 formed on the inner shaft 66, and formed in parallel with the axis of the gas supply passage 72 respectively. In this apparatus, lower ends 76b of the outer gas supply passages 76a are downwardly outwardly inclined to be radially formed on the atmosphere blocking member 62 in plan view. Respective outlets of the lower ends 76b of the plurality of outer gas supply passages 76a define a plurality of outer gas discharge ports 78 opening on the surface of the atmosphere blocking member 62 opposed to the upper surface of the wafer W. The plurality of outer gas discharge ports 78, which are circumferentially uniformly distributed to enclose the gas discharge port 74, are formed closer to the peripheral edge of the atmosphere blocking member 62 as compared with the outer gas discharge ports 58 of the apparatus shown in FIGS. 7 and 8.

The substrate processing apparatus according to the fourth embodiment also discharges the process gas from the gas discharge port 74 and the plurality of outer gas discharge ports 78 of the atmosphere blocking member 62 similarly to the apparatus shown in FIGS. 7 and 8, to attain a similar function/effect.

FIGS. 11A and 11B illustrate the plurality of outer gas discharge ports 78 starting discharging the process gas in a delay from the gas discharge port 74. As shown in FIG. 11A, the gas discharge port 74 first discharges the process gas toward the central portion of the upper surface of the wafer W for washing away deionized water 1 remaining on the central portion of the upper surface of the wafer W toward the periphery of the wafer W and expelling the same from the central portion of the wafer W. Then, the plurality of outer gas discharge ports 78 discharge the process gas toward the upper surface of the wafer W as shown in FIG. 11B showing only one side of the atmosphere blocking member 62, for scattering the deionized water 1 washed away from the central portion of the upper surface of the wafer W toward the periphery from the outer periphery to the outer peripheral direction along with deionized water originally remaining on the periphery and expelling the same. At this time, the plurality of outer gas discharge ports 78 obliquely outwardly discharge the process gas toward the upper surface of the wafer W respectively, whereby the substrate processing apparatus can efficiently expel the ionized water 1 from the periphery of the upper surface of the wafer W at a smaller gas flow rate. Also this apparatus may stop or keep discharging the process gas from the gas discharge port 74 after starting discharging the process gas from the outer gas discharge ports 78, or may stop discharging the process gas from the gas discharge port 74 alone after a lapse of a prescribed time from starting discharging the process gas through the outer gas discharge ports 78.

5. Modifications

Figure 13:
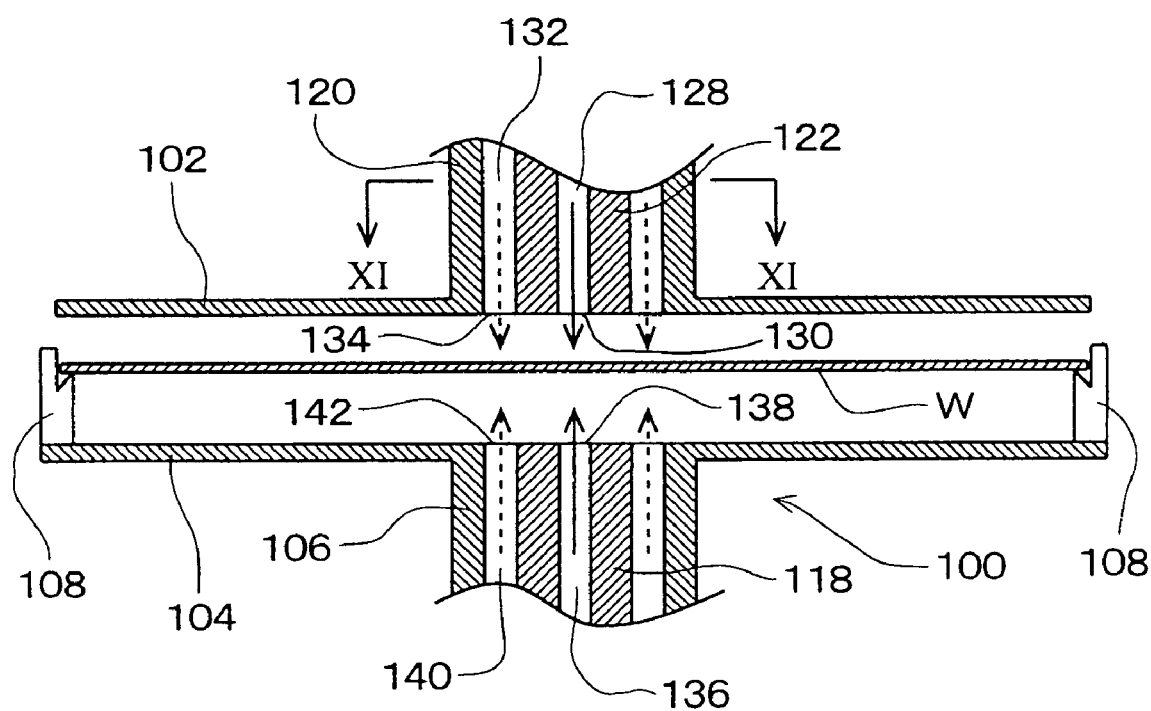
FIG. 13 is a longitudinal sectional view showing the structure of a principal part of the substrate processing apparatus shown in FIG. 12.
Figure 14:
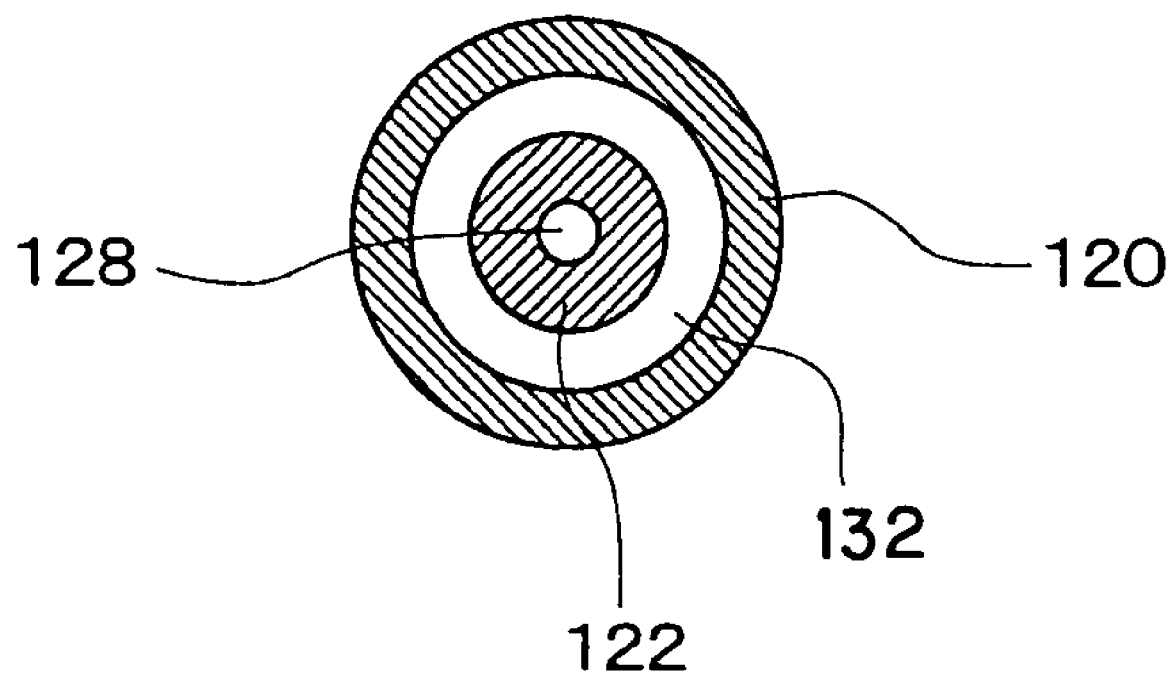
FIG. 14 is a sectional view taken along the line XI-XI in FIG. 13.
Figure 15:
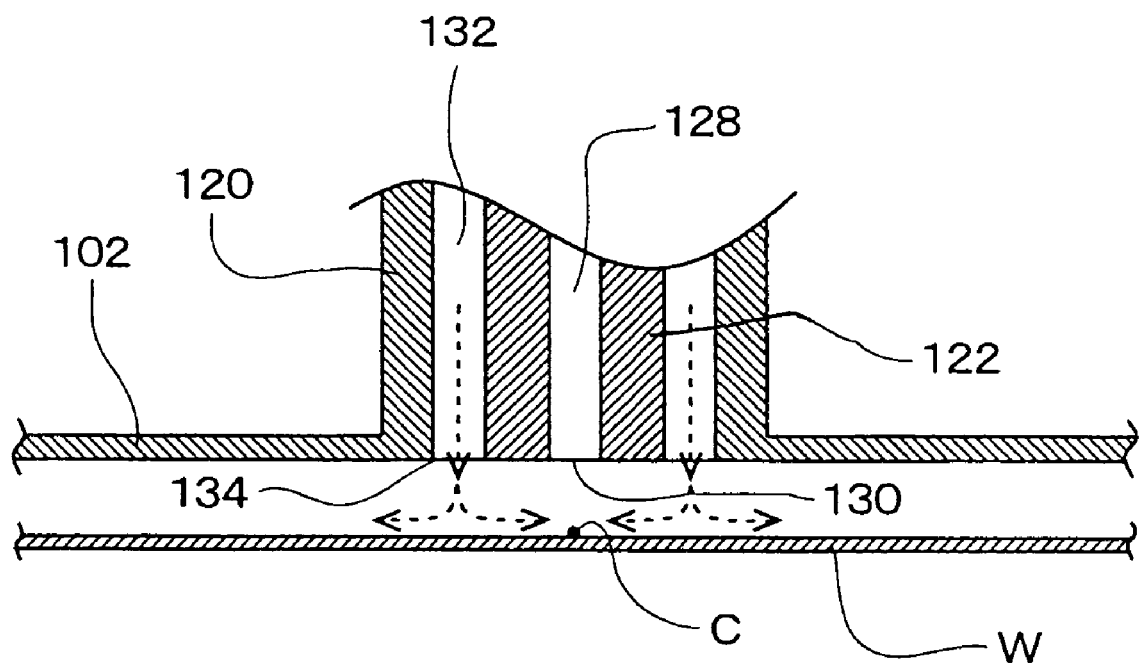
FIG. 15 is a longitudinal sectional view of the principal part for illustrating a problem of the conventional apparatus shown in FIGS. 13 and 14.
Figure 16:
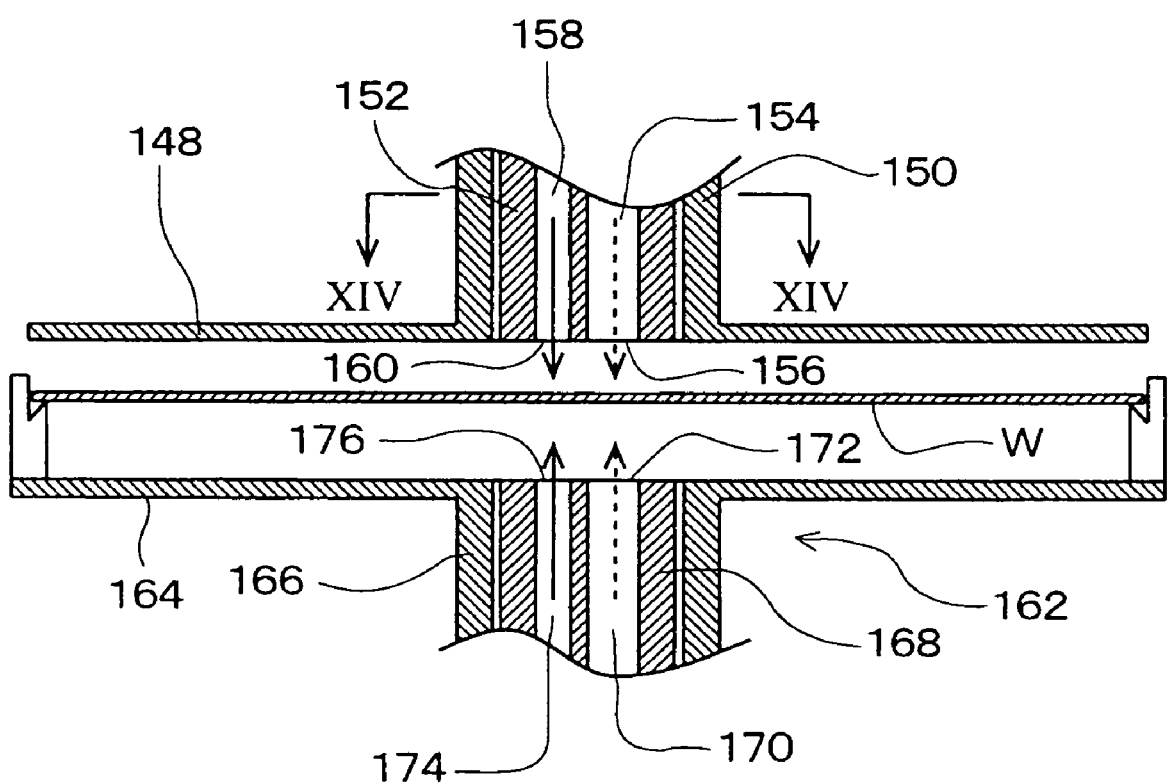
FIG. 16 is a longitudinal sectional view showing the structure of a principal part of another exemplary conventional substrate processing apparatus.

While the embodiments of the present invention have been described, the present invention is not restricted to the aforementioned examples. For example, while the spin base, the rotary cylinder and the inner shaft of the spin chuck are different in structure from the atmosphere blocking member and the rotary support cylinder and the inner shaft thereof respectively in each of the aforementioned embodiments, the former may be rendered similar to the latter in structure as in each of the apparatuses shown in FIGS. 13 and 16 so that the spin base sufficiently serves as the atmosphere blocking member for the lower surface of the wafer W held by the same.

While the outer gas discharge port 40 discharges the process gas to the portion close to the center of the upper surface of the wafer W in the aforementioned first embodiment and the outer gas discharge port 99 discharges the process gas to the portion close to the intermediate portion between the center and the outer peripheral edge of the upper surface of the wafer W in the second embodiment, the present invention is not restricted to this but the outer gas discharge port may alternatively be formed on the atmosphere blocking member so that the gas discharged from the outer gas discharge port arrives at a portion closer to the center than the intermediate portion between the center and the outer peripheral edge of the upper surface of the wafer W held on the spin base 14. In this case, at least an effect similar to that of the first embodiment can be attained.

Also as to each of the aforementioned third and fourth embodiments, the outer gas discharge ports 58 or 78 may be formed on the atmosphere blocking member 42 or 62 so that the gas discharged from the same arrives at a portion closer to the center than the intermediate portion between the center and the outer peripheral edge of the upper surface of the wafer W held on the spin base 14. Particularly when the gas discharged from the outer gas discharge ports 78 of the substrate processing apparatus according to the fourth embodiment arrives at a portion close to the intermediate portion between the center and the outer peripheral edge of the upper surface of the wafer W held on the spin base 14, the outer gas discharge ports 78 obliquely outwardly discharge the process gas with respect to a limit position capable of expelling the deionized water 1 with the process gas discharged from the gas discharge port 74 and hence the substrate processing apparatus can efficiently expel the ionized water 1 from the periphery of the upper surface of the wafer W at a smaller gas flow rate.

As to the mode of discharging the process gas, both of the gas discharge port and the outer gas discharge port(s) may discharge the process gas in the cleaning processing with the chemical solution and/or the rinse processing with the deionized water. For example, the substrate processing apparatus according to the first embodiment may discharge the process gas from the gas discharge port 36 toward the central portion of the upper surface of the wafer W while discharging the process gas also from the outer gas discharge port 40 in the cleaning processing with the chemical solution and/or the rinse processing with the deionized water.

Thus, the substrate processing apparatus can let the outer gas discharge port 40 take charge of discharge of the process gas from the gas discharge port 36 whose aperture is so small that the quantity of discharge is limited, for further quickly replacing the atmosphere and further reducing the load on the gas discharge port 36.

Then, the substrate processing apparatus increases the flow rate of the discharged process gas beyond that in the cleaning processing with the chemical solution and/or the rinse processing with the deionized water after completely cleaning and rising the wafer W with the chemical solution and the deionized water respectively and before spin-drying the wafer W by high-speed rotation, for discharging the process gas from the gas discharge port 36 and the outer gas discharge port 40.

The flow rate distribution between the gas discharge port 36 and the outer gas discharge port 40 is not restricted to 20 l/min. and 80 l/min. but the substrate processing apparatus may alternatively set the total flow rate of the process gas discharged toward the upper surface of the wafer W to 100 l/min. for discharging the process gas from the gas discharge port 36 and the outer gas discharge port 40 at flow rates of 40 l/min. and 60 l/min. respectively.

In other words, the substrate processing apparatus may increase the flow rate discharged from the gas discharge port 36 beyond that in the aforementioned first embodiment, thereby quickening the timing for discharging the process gas from the outer gas discharge port 40.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus operable to supply a fluid to a rotated substrate, the substrate processing apparatus operable to perform prescribed processing and comprising:
   a substrate holding/rotating element configured and operable to hold and to rotate said substrate; and
   an atmosphere blocking plate configured to be substantially the same in planar shape and size as said substrate holding/rotating element, being rotatably driven and being arranged oppositely and proximately to at least one entire major surface of said substrate when said substrate is held by said substrate holding/rotating element, and formed with a processing solution discharge port and a single inner gas discharge port operable to discharge a processing solution and gas to said surface of said substrate respectively,
   a tubular support cylinder supporting said atmosphere blocking plate to be rotatable and having a hollow portion therein; and
   a cylindrical inner shaft inserted into the hollow portion of said support cylinder;
   said inner shaft and said support cylinder arranged coaxially with each other,
   said processing solution discharge port and said single inner gas discharge port arranged on said inner shaft in plan view, with a center of said single inner gas discharge port arranged eccentrically to a center of said inner shaft; and
   an annular outer gas discharge port operable to discharge gas to said surface of said substrate held by said substrate holding/rotating element, the outer gas discharge port formed on said atmosphere blocking plate and interposed between an outer peripheral surface of said inner shaft and an inner peripheral surface of said support cylinder in plan view so as to continuously and annularly enclose said single inner gas discharge port.

2. The substrate processing apparatus according to claim 1, wherein said outer gas discharge port is so formed on said atmosphere blocking plate such that an arrival position of said gas discharged from said outer gas discharge port is in the vicinity of said intermediate portion between the center and the outer peripheral edge of said surface of said substrate held by said substrate holding/rotating element.

* * * * *